United States Patent [19]

Maniar et al.

[11] Patent Number: 5,605,865
[45] Date of Patent: Feb. 25, 1997

[54] METHOD FOR FORMING SELF-ALIGNED SILICIDE IN A SEMICONDUCTOR DEVICE USING VAPOR PHASE REACTION

[75] Inventors: Papu D. Maniar; Arkalgud R. Sitaram, both of Austin, Tex.

[73] Assignee: Motorola Inc., Schaumburg, Ill.

[21] Appl. No.: 416,124

[22] Filed: Apr. 3, 1995

[51] Int. Cl.$^6$ .................................................. H01L 21/285
[52] U.S. Cl. ............................................ 437/200; 437/245
[58] Field of Search ........................................ 437/200, 245, 437/184; 427/126.6

[56] References Cited

U.S. PATENT DOCUMENTS

| | | | |
|---|---|---|---|
| 4,619,038 | 10/1986 | Pintchovski | 29/590 |
| 4,814,294 | 3/1989 | West et al. | 437/200 |
| 4,938,999 | 7/1990 | Jenkin | 427/252 |
| 5,190,893 | 3/1993 | Jones, Jr. et al. | 437/192 |

*Primary Examiner*—R. Bruce Breneman
*Assistant Examiner*—R. Paladugu
*Attorney, Agent, or Firm*—Patricia S. Goddard

[57] ABSTRACT

Self-aligned silicide regions (24) are formed in a semiconductor device (10) using vapor phase reaction. A chemical vapor deposition system (40) is used, but rather than depositing a blanket silicide material, a precursor (48) is introduced into the reaction chamber (42) and reacts with only exposed silicon and polysilicon members of the device. The reaction is assisted by heating the substrate to a temperature at which the precursor is volatile. Because the precursor source reacts only with exposed silicon and polysilicon regions, subsequent etch steps are unnecessary. In one form, cobalt silicide regions are formed using a cobalt carbonyl as the precursor source.

16 Claims, 2 Drawing Sheets

METHOD FOR FORMING SELF-ALIGNED SILICIDE IN A SEMICONDUCTOR DEVICE USING VAPOR PHASE REACTION

FIELD OF THE INVENTION

The present invention relates to fabricating semiconductor devices in general, and more specifically to forming self-aligned silicide regions in semiconductor devices.

BACKGROUND OF THE INVENTION

Metal silicides are often formed on semiconductor substrate doped regions, polysilicon members, and metal members within semiconductor devices to reduce contact resistance. More common silicides used in the semiconductor industry include titanium silicide ($TiSi_2$), molybdenum silicide ($MoSi_2$) and cobalt silicide ($CoSi_2$). Of these silicides, cobalt silicide is preferred from the perspective that it has the least resistance of any of the other silicides. However, titanium silicide is more prevalent in devices because it is easier to manufacture in view of current problems with cobalt silicide formation processes.

There are two primary known methods of forming cobalt silicide. In one process, a layer of cobalt is sputtered deposited onto a semiconductor substrate having exposed silicon and/or polysilicon regions. The cobalt layer is then annealed at a low temperature to form $Co_2Si$ and $CoSi$ where the cobalt layer is in intimate contact with the silicon or polysilicon regions. In this anneal process, only the portion of the cobalt layer in contact with the exposed silicon or polysilicon regions will be reacted, thus the silicidation is selective. After forming $Co_2Si$ and $CoSi$, unreacted portions of the cobalt layer are selectively removed, leaving only that portion of the layer which has undergone silicidation. Selective removal of the unreacted cobalt layer is most often accomplished by using a solution of phosphoric, nitric, acetic and sulfuric acids. After removing unreacted portions of the cobalt layer the substrate is further annealed at a higher temperature to transform the $Co_2Si$ and $CoSi$ compounds into $CoSi_2$. $CoSi_2$ has a lower resistivity than $Co_2Si$ and $CoSi$ formed in the initial anneal step, and thus is preferred. While this silicidation process has the advantage of forming self-aligned cobalt silicide regions, other drawbacks to the process make it undesirable. One problem is the ability to control the initial anneal step used to form $Co_2Si$ and $CoSi$. The anneal must be done at controlled, low temperatures, for example 400°–500° C., in order to prevent silicidation of the cobalt layer in regions which are not in intimate contact with silicon. For example, in simultaneously forming silicide regions on a gate electrode and source and drain regions of a metal oxide semiconductor field effect transistor (MOSFET), wherein the source and drain are only separated from the gate by a small sidewall spacer, there is a risk that a portion of the blanket cobalt layer overlying the sidewall spacer would itself form a silicide region, thereby bridging the source and drain regions to the gate electrode and electrically short circuiting the device. To prevent this bridging, the temperature of the initial anneal step must be well controlled and kept low. With the emergence of rapid thermal processing techniques, such a tightly controlled process has become difficult to achieve. Another problem is the ability to physically deposit a thin enough cobalt layer which is continuous and uniform across the entire device. Due to the high rate of consumption of silicon during the silicidation anneals (3.6 Å of silicon being consumed for every angstrom of cobalt), the cobalt layer must be kept thin (about 100 Å) to avoid too much consumption of the underlying silicon. Yet in depositing such thin layer using sputter deposition, there is a risk of forming discontinuous films. Yet another problem is that sputter deposition processes are inherently dirty and can lead to contamination of any silicide regions formed.

Another known process for forming cobalt silicide regions is a process involving chemical vapor deposition (CVD), and is described in U.S. Pat. No. 4,814,294. In the CVD process, a cobalt precursor (for example a cobalt carbonyl) and a silicon precursor (for example a silane) are introduced into a reaction chamber in a precisely controlled ratio to react and deposit a cobalt silicide layer onto a heated substrate within the reaction chamber. While the CVD process overcomes many of the problems associated with the sputter deposition process, it suffers from a different problem. More specifically, the CVD process is not selective. The reaction which takes place in the CVD chamber results in a blanket layer of cobalt silicide deposited across the entire substrate. Accordingly, it is necessary to remove portions of the deposited cobalt silicide film which are unwanted. An etch thus has to be developed to be able to remove the cobalt silicide selectively to underlying layers of the device, and etch undesirably adds another processing step to device fabrication. Suitable dry etches to remove cobalt without removing cobalt silicide have yet to be developed. While cobalt can be etched selectively to cobalt silicide by HF solutions, concentrated HCl solutions, and concentrated aqueous alkali solutions, these etches attack cobalt very slowly. Furthermore, the need for an etch process undesirably increases the time required and costs imposed for manufacturing.

Therefore, it appears that a need exists for an improved cobalt silicide formation process which results in selective formation of cobalt silicide to remove the need for subsequent etching, which can be performed independent of the inherent problems with sputter deposition and rapid thermal processing equipment, and which results in uniform and controlled silicide region thicknesses across the device.

DETAILED DESCRIPTION OF A PREFERRED EMBODIMENT

Figure 1:
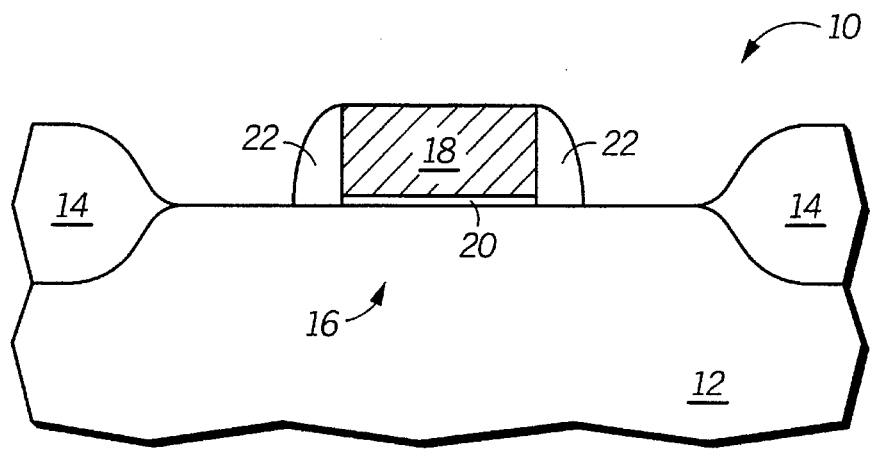
FIGS. 1–3 illustrate in partial cross-sectional views a process for forming self-aligning silicide regions in a MOSFET in accordance with one embodiment of the present invention.

Generally, the present invention provides a method for forming self-aligned silicide regions, particularly cobalt silicide regions, using vapor phase reaction. A semiconductor substrate having exposed silicon or polysilicon regions is placed in a reaction chamber of a chemical vapor deposition system and heated to a low temperature. A cobalt precursor gas, preferably in the form of a cobalt carbonyl, is flowed into the reaction chamber and over the heated substrate. An inert carrier gas, such as nitrogen, can be used to deliver the cobalt precursor into the reaction chamber, but other precursor gases are not necessary. In the chamber, the cobalt precursor selectively reacts with only exposed silicon or polysilicon regions to form a thin layer of cobalt silicide on these regions. Accordingly, a blanket layer of cobalt silicide is not formed, which eliminates the necessity for a subsequent cobalt silicide etch process. Moreover, use of a vapor phase reaction as compared to a sputter deposition process results in more uniform silicide thicknesses which are continuous in the appropriate regions. In a preferred form, a high temperature anneal is then used to convert the initial $Co_2Si$ and $CoSi$ compounds into a less resistive $CoSi_2$. In the case of forming silicide regions for a MOSFET, ion implantation is performed after the high temperature anneal to form source and drain regions with very shallow junctions in appropriate areas of the device.

These and other features and advantages will be more clearly understood from the following detailed description taken in conjunction with the accompanying drawings. It is important to point out that the illustrations are not necessarily drawn to scale and that there may be other embodiments of the present invention which are not specifically illustrated. Further, it is noted that like reference numerals are sometimes used to designate identical or corresponding parts throughout the several views referred to in this description.

Figure 2:
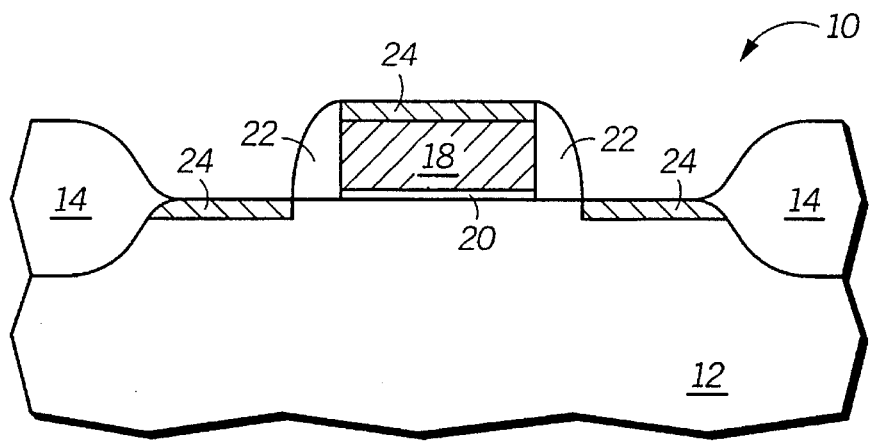
Figure 3:
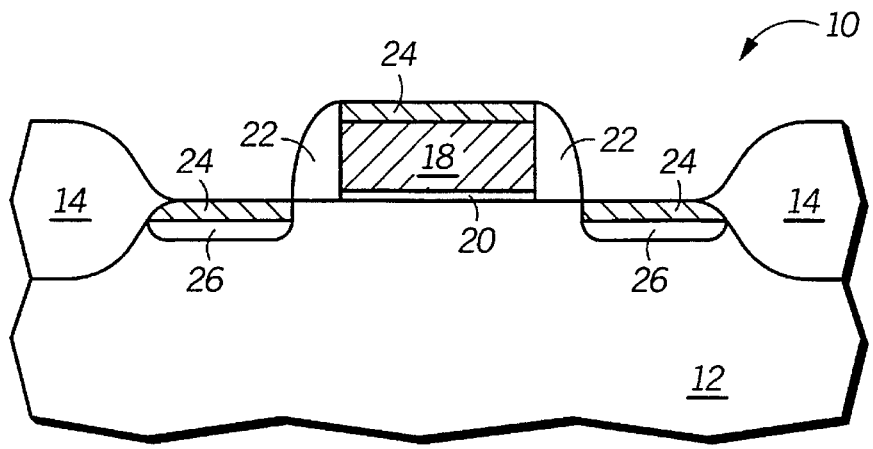

FIGS. 1–3 illustrate a portion of a semiconductor device 10 in cross-section, as the device undergoes processing steps in accordance with the present invention. That portion of device 10 illustrated in FIGS. 1–3 represents the formation of a MOSFET. However, it is understood that the present invention can be used at any point in semiconductor manufacturing calling for the formation of a silicide, and is not restricted to using that silicide in transistor structures. For example, silicides are often used to lower the resistance of contacts between various conductive layers in a semiconductor device. The present invention will benefit these applications, as well as others.

Device 10 as illustrated in FIG. 1 includes a semiconductor substrate 12 having field isolation regions 14 which define boundaries of an active region 16. Substrate 12 will likely be a single crystal silicon wafer or other semiconducting material, such as gallium arsenide, silicon-on-insulator, and the like. Field isolation regions 14 are formed by oxidizing substrate 12 using conventional processes, for instance localized oxidation of silicon (LOCOS). Alternatively, trench isolation regions can be formed in substrate 12 to provide the necessary electrical isolation between active regions. Within active region 16, a gate electrode 18 of a bulk MOSFET is formed in accordance with conventional methods. Typically gate electrode 18 is formed by depositing and patterning a polysilicon layer which is separated from substrate 12 by a thin, thermally grown gate oxide layer 20. Also in accordance with known methods, sidewall spacers 22 are formed along sidewalls of the gate electrode. Sidewall spacers 22 are typically formed of silicon nitride. It is noted that the gate electrode structure illustrated in FIG. 1 is merely representative of a typical MOSFET gate structure, and is no way intended to limit the scope of the present invention. As previously mentioned, the present invention is applicable to the silicidation of any exposed silicon members in a semiconductor device, and is not specifically limited to gate structures or to a particular type of gate structure.

In completing the MOSFET in device 10, a source and drain region will be formed in substrate 12. Thereafter, a variety of dielectric and conductive layers will be deposited onto device 10 to establish electrical connections to the gate electrode and the source and drain regions while establishing electrical isolation between various other integrated devices and layers. In making such electrical connections, it is known to silicide the region to be contacted in order to lower the resistance of the contact. In accordance with an embodiment of the present invention, the gate electrode and the portions of active region 16 where a source and drain are to be formed are silicided using a vapor phase reaction. As illustrated in FIG. 2, silicide regions 24 are formed only on exposed silicon or polysilicon regions of the device. Specifically, the silicide regions are formed on the exposed upper surface of gate electrode 18, and on exposed portions of substrate 12 within active region 16 which are not covered by the gate electrode structure.

Figure 4:
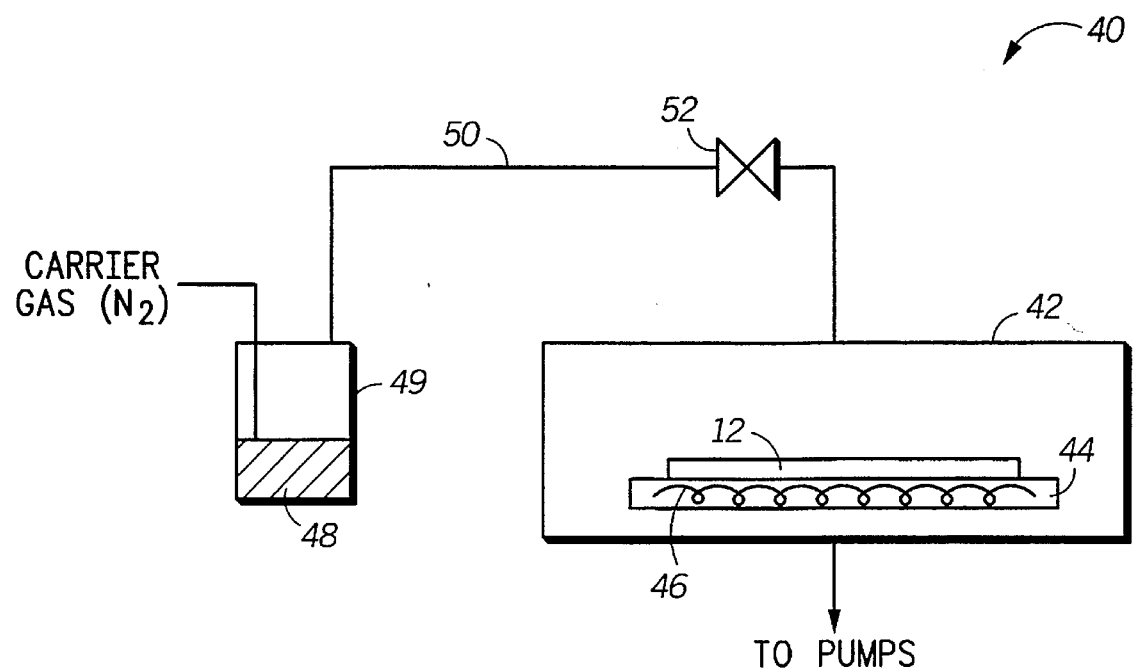
FIG. 4 is a schematic view of a vapor phase reaction system used for forming silicide regions in accordance with the present invention.

In accordance with the present invention, silicide regions 24 are formed by placing substrate 12 (for example, as processed through FIG. 2) in a chemical vapor deposition system 40, illustrated in FIG. 4. Preferably, system 40 is a low pressure CVD (LPCVD) system. It is noted that while a CVD system is used in practicing the invention, a deposition does not actually occur. Rather, a reaction occurs in the system to convert an existing substrate material (namely silicon) to silicide. Thus, the present process is more appropriately termed a vapor phase reaction, as opposed to a chemical vapor deposition.

System 40 includes a reaction chamber 42 having a substrate holder 44. In a preferred form, substrate holder 44 is resistively heated by heater 46. Chamber 42 is not otherwise heated. Substrate 12 is placed on substrate holder 44 within the reaction chamber. Heater 46 heats substrate 12 to a temperature of between 200° C. and 400° C. prior to introducing a precursor source vapor into the chamber. The precursor source vapor may be introduced by providing a precursor 48 contained within a vessel 49. If heated within the vessel, the precursor should be kept below 200° C. The precursor source vapor is delivered from the vessel through lines 50 into the reaction chamber. Like vessel 49, if lines 50 are heated, the lines should be kept below 200° C. Precursor 48 can be in the form of a gas or a liquid, and delivery to the reaction chamber can be assisted through the use of an inert carrier gas, such as nitrogen. For instance, the nitrogen gas can be bubbled into a liquid precursor within vessel 49, wherein the resulting vapors are delivered through the lines and into the chamber. Alternatively, another gas can be separately introduced into reaction chamber with the precursor to maintain chamber pressure. Pressure within the chamber is controlled to between about 10 milliTorr to 1 atmosphere. Precise pressures suitable will depend upon other parameters, including the type of precursor used, the temperature of the substrate, and the temperature of the precursor as delivered.

In the specific instance of forming cobalt silicide on device 10, precursor 48 is preferably a precursor selected from the group of cobalt carbonyls, including $Co_2CO_8$, $HCo(CO)_4$, $Co_4CO_{12}$, or $RCo(CO)_3$ where R is $C_xH_{(2x+1)}$. In choosing the cobalt precursor, an important characteristic of the particular source chosen is that it be volatile at a temperature below 400° C. The preference for using sources which decompose below 400° C. relates to the bridging problem discussed previously in reference to prior art cobalt silicide information processes. Above 400° C., there is a potential for cobalt atoms within the reaction chamber to also react with silicon in the silicon nitride spacers 22. Upon reacting, a cobalt silicide is also formed on the sidewall spacers thereby bridging and electrically short circuiting the silicide region 24 formed on the gate electrode and that formed on active region 16. Annealing below 400° C. in a cobalt environment will prevent such unwanted reaction and maintain the selectivity of the silicidation process.

The flow of the precursor vapor into reaction chamber 42, along with the control of the temperature of substrate holder 44, are used to control the thickness of the silicide regions formed. Specific vapor flows will depend upon the particular system configuration employed. Flow rates of the carrier gas and precursor into the reaction chamber can be monitored and controlled by a conventional mass flow controller 52. In addition to the flow rates, the time period for forming the silicide regions will also affect the thickness, but without specific system configuration and other process parameter information a precise time range for the reaction cannot be given. In general, it is expected that a reaction period of between 10 seconds to 15 minutes will be suitable. Preferably, the reaction is carried out to result in silicide regions having a thickness of between 200 and 500 angstroms. These thicknesses are most desirable to avoid excessive consumption of silicon in junction regions (to be formed after the silicidation process). As mentioned above, prior art sputter deposition processes have problems in achieving such small thicknesses while maintaining continuity due to the physical limitations of sputter deposition and rapid thermal processes. In practicing the present invention, on the other hand, the thickness of the silicide regions can be tightly controlled by controlling the gas flow and temperature of the substrate, without concern of forming discontinuous silicide regions since the source vapor will uniformly react with all exposed silicon and polysilicon surfaces.

After initially reacting the precursor source vapor with exposed silicon and polysilicon regions on substrate 12, gas flows into the reaction chamber are ceased and the substrate undergoes a high temperature anneal. Preferably the heat temperature is performed within the same reaction chamber for ease of manufacturing, but this is not required. The subsequent anneal is preferably performed at temperatures between 600° C. and 800° C., and most preferably around 700° C. This high temperature anneal is performed to convert $Co_2Si$ and $CoSi$ regions into lower resistivity $CoSi_2$ regions. Additional silicon will be consumed during this high temperature anneal; however, the time and temperature controls are less critical than the during the initial silicide formation process. At the high temperature anneal stage, there is no danger of electrically short circuiting or bridging adjacent silicide regions because no cobalt or silicide is present during the high temperature anneal to react with sidewall spacers 22. Notwithstanding, expected duration for the high temperature anneal is between about 10 to 30 seconds.

As illustrated in FIG. 3, after forming silicide regions 24 in active region 16, device 10 undergoes an ion implantation operation using a dopant to form doped regions 26 within active region 16. Doped regions 26 will serve as a source and drain regions of the MOSFET. It is preferred that the doped regions be formed after forming silicide regions 24 to reduce the risk of punch through and to establish more uniform junctions. After forming doped regions 26, device 10 undergoes conventional processing steps (not illustrated) to complete the integrated circuit device. For example, interlayer dielectrics, additional polysilicon layers, metal layers, and passivation are deposited and patterned as the device design requires. It is noted that in these subsequent processing steps, it may be again desirable to form silicide regions in accordance with the process of the present invention as described above.

In another embodiment of the present invention, molybdenum silicide regions may be formed by also using vapor phase reaction. Processes similar to that described in reference to FIGS. 1–4 are utilized in this embodiments, except that the precursor 48 is in the form of a molybdenum carbonyl $[Mo(CO)_6]$. In using molybdenum carbonyls as a precursor, processing temperatures would need to be modified according to the volatility of the of the particular precursor material used. In using $Mo(CO)_6$, a preferred molybdenum carbonyl, the substrate should be heated to a temperature of between 400° C. to 700° C. to initiate a reaction between the molybdenum and exposed silicon surfaces. After initially forming molybdenum compounds at a lower temperature, the compounds are preferably converted to a lower resistivity phase compound by annealing at a higher temperature, above 800° C., for example about 900° C.

By using a silicidation process in accordance with the present invention, many of the problems associated with prior art processes are overcome. For example, the present invention does not utilize physical vapor deposition (sputtering processes) which often produce discontinuous films when trying to form films of 100 Å or less. Moreover, by eliminating the need to deposit a blanket source metal layer, the need to have a very tightly controlled rapid thermal anneal process to convert the source metal to silicide is also eliminated. Instead, the present invention relies upon the control of gas flow into the reaction chamber and the temperature of the substrate within the chamber, both of which are easily controlled. Thus, the present invention has the benefits of a chemical vapor deposition process, but is selective because silicide is formed without a silicon source precursor. A further advantage in eliminating the sputter deposition of the source metal layer is an improved step coverage of the silicide. When the topography below the silicide layer is high, a physical deposition process can lead to discontinuous films while a chemical process provides better uniformity. In forming cobalt silicide in accordance with the invention, an advantage is that cobalt carbonyls will decompose at lower temperatures (less than 400° C.) so that $Co_2Si$ and $CoSi$ compounds can be initially formed in the silicidation process, without any formation of silicide on silicon dioxide or silicon nitride materials which may also be exposed. A subsequent high temperature anneal in the absence of the cobalt precursor can then be used to transform these compounds into lower resistivity $CoSi_2$ compounds, without need for an etch process. If such high temperatures were used to initially form the silicide regions, the potential of bridging to nearby silicon or polysilicon regions exists. The selective silicide formation process in accordance with the present invention reduces a number of processing steps necessary to form cobalt silicide regions. Specifically, the need to etch or otherwise remove unreacted portions of a blanket cobalt layer, or unwanted portions of a blanketly deposited cobalt silicide layer, is eliminated. Moreover, the quality of the silicide regions formed by the present invention is improved over prior art processes. Silicide regions formed in accordance with the invention will be uniform and continuous on all exposed silicon and polysilicon regions of the device.

Thus it is apparent that there has been provided in accordance with the present invention a method for forming self-aligned silicides in a semiconductor device that fully meets the need and advantages set forth above. Although the invention has been described and illustrated with reference to specific embodiments thereof. It is not intended that the invention be limited to these illustrative embodiments. Those skilled in the art will recognize that modifications and variations can be made without departing from the spirit of the invention. For example, the invention is not limited to forming silicide regions on MOSFET elements. Silicide regions can be formed on any silicon or polysilicon member present within a semiconductor device. In addition to applications in MOSFET, the present invention is likely to provide benefits with window polysilicon and contact structures of devices as well. It is also important to note that when forming cobalt or molybdenum silicide, the precursors are not specifically limited to carbonyls. Furthermore, other heating methods to form the silicide may be suitable. For example, rather than heating the substrate, a heated precursor gas could be introduced over an unheated, or reduced temperature, substrate. Therefore, it is intended that this invention encompass all such variations and modifications as fall within the scope of the appended claims.

We claim:

1. A method for forming self-aligned silicide in a semiconductor device comprising the steps of:

providing a semiconductor substrate having exposed silicon regions;

placing the semiconductor substrate in a reaction chamber;

introducing a cobalt precursor into the reaction chamber, without also introducing a silicon source gas; and exposing the cobalt precursor to a heat sufficient to react the cobalt precursor with the exposed silicon regions to form cobalt silicide regions only on the exposed silicon regions.

2. The method of claim 1 wherein the step of exposing the cobalt precursor to a heat comprises heating the semiconductor substrate to create a heated substrate and flowing the cobalt precursor over the heated substrate.

3. The method of claim 1 wherein the step of introducing a cobalt precursor comprises introducing a cobalt carbonyl.

4. The method of claim 3 wherein the step of introducing a cobalt carbonyl comprises introducing a cobalt carbonyl selected from a group consisting of $Co_2CO_8$, $HCo(CO)_4$, $Co_4CO_{12}$, and $RCo(CO)_3$ where R is $C_xH_{(2x+1)}$.

5. The method of claim 3 wherein the step of exposing the cobalt precursor to a heat comprises exposing the cobalt precursor to a heat having a temperature of less than 400° C.

6. The method of claim 1 further comprising the step of annealing the cobalt silicide regions at a temperature above 600° C. to lower a resistivity of the cobalt silicide regions.

7. The method of claim 1 further comprising the step of implanting a dopant into the cobalt silicide regions.

8. A method for forming self-aligned silicide in a semiconductor device comprising the steps of:

providing a semiconductor substrate having exposed silicon regions;

placing the semiconductor substrate in a reaction chamber;

introducing a molybdenum precursor into the reaction chamber; and exposing the molybdenum precursor to a heat sufficient to react the molybdenum precursor with the exposed silicon regions to selectively form molybdenum silicide regions on the exposed silicon regions.

9. The method of claim 8 wherein the step of introducing a molybdenum precursor comprises introducing a molybdenum carbonyl.

10. The method of claim 8 wherein the step of exposing the molybdenum precursor to a heat comprises heating the semiconductor substrate to create a heated substrate and flowing the molybdenum precursor over the heated substrate.

11. The method of claim 8 wherein the step of exposing the molybdenum precursor to a heat comprises exposing the molybdenum precursor to a heat having a temperature of less than 700° C.

12. The method of claim 8 further comprising the step of annealing the molybdenum silicide regions at a temperature above 800° C. to lower a resistivity of the molybdenum silicide regions.

13. A method for forming self-aligned silicide in a semiconductor device comprising the steps of:

providing a silicon substrate;

forming a gate dielectric on the silicon substrate;

depositing a polysilicon layer on the gate dielectric;

etching the polysilicon layer to form a gate electrode;

etching portions of the gate dielectric beyond the gate electrode to expose a surface of the silicon substrate;

placing the silicon substrate in a reaction chamber;

heating the silicon substrate to a first temperature; and introducing a gas selected from a group consisting of a cobalt carbonyl and a molybdenum carbonyl into the reaction chamber, without introducing a gaseous silicon source, to selectively form a silicide on the gate electrode and the surface of the silicon substrate.

14. The method of claim 13 wherein the step of introducing comprises introducing a cobalt carbonyl gas selected from a group consisting of $Co_2CO_8$, $HCo(CO)_4$, $Co_4CO_{12}$, or $RCo(CO)_3$ where R is $C_xH_{(2x+1)}$.

15. The method of claim 13 further comprising the step of annealing the silicon substrate at a second temperature which is higher than the first temperature to lower resistivity of the silicide.

16. The method of claim 13 further comprising the step of implanting a dopant into the surface of the silicon substrate, through the silicide.

* * * * *